United States Patent [19]
Tucker et al.

[11] Patent Number: 5,987,392
[45] Date of Patent: Nov. 16, 1999

[54] WAVE FORM PEAK DETECTOR

[76] Inventors: Lawrence J. Tucker, 10749 Charring Cross Cir., Whitmore Lake, Mich. 48189; Michael E. Murphy, 1301 Colgate Cir., Ann Arbor, Mich. 48103

[21] Appl. No.: 08/911,378

[22] Filed: Aug. 14, 1997

[51] Int. Cl.⁶ .................................................. G01R 19/04
[52] U.S. Cl. ........................................ 702/66; 341/132
[58] Field of Search ................... 327/58; 73/770; 324/103 R, 103 P; 341/132

[56] References Cited

U.S. PATENT DOCUMENTS

| | | |
|---|---|---|
| 4,112,381 | 9/1978 | Mortensen et al. . |
| 4,257,104 | 3/1981 | Martin et al. . |
| 4,264,958 | 4/1981 | Rowell, Jr. et al. . |
| 4,362,996 | 12/1982 | Priebe . |
| 4,564,804 | 1/1986 | Wilke et al. . |
| 4,578,667 | 3/1986 | Hollister . |
| 4,613,814 | 9/1986 | Penney . |
| 4,654,808 | 3/1987 | Potter et al. . |
| 4,654,809 | 3/1987 | Adcock . |
| 4,658,367 | 4/1987 | Potter . |
| 4,686,390 | 8/1987 | Cleary, Jr. et al. . |
| 4,864,167 | 9/1989 | McKibben et al. . |
| 5,155,431 | 10/1992 | Holcomb . |
| 5,303,262 | 4/1994 | Johnson . |

*Primary Examiner*—Marc S. Hoff
*Assistant Examiner*—Linh Nguyen

[57] ABSTRACT

Peak detection is conducted by converting a continuous waveform into discrete samples. The discrete samples are evaluated to identify three points near a peak of the continuous waveform. After the three points near the peak are identified, they are stored in a discrete domain data structure which is used in conjunction with a table generated from a continuous transformation function in order to identify an accurate peak amplitude and time.

20 Claims, 4 Drawing Sheets

WAVE FORM PEAK DETECTOR

BACKGROUND OF THE INVENTION

1. Field of the Invention

The present invention is directed to precise waveform peak detection, and is more particularly directed to an apparatus and methodology which efficiently provides high accuracy peak amplitude and time identification for a wide bandwidth.

2. Description of Related Art

Analog peak detectors generally fall into two categories; very accurate with a narrow bandwidth or inaccurate with a wide bandwidth. At low frequencies (e.g., audio), it is possible to use operational amplifiers to build precision peak detectors. These configurations can be very accurate, but fall prey to narrow bandwidth limitations. Other analog designs have much wider bandwidths (up to a few MHz), but fall prey to inaccuracies that are due to non-linear gain functions which limit useful operation to a small amplitude range. Furthermore, their use is generally acceptable only when errors of several percent can be tolerated.

The alternate approach to analog peak detection is through digital analysis of waveforms. This involves the use of an analog-to-digital converter (ADC) that digitizes an input signal with an evaluation of the resulting discrete values conducted in order to identify signal peaks and their corresponding characteristics (i.e., amplitude and time of occurrence). One particular method consists of very high speed ADC sampling and subsequent digital magnitude comparisons. While this is a straightforward approach, typically the sample rate of an ADC is not fast enough to guarantee that a data point is taken at the exact time of the signal peak. Instead, a sample on either side of the peak is identified as the true peak, thereby resulting in a reported peak value which is somewhat smaller than the actual value.

For high frequency input signals, e.g. several MHZ, it is also difficult to obtain an ADC sample rate that is sufficient to provide high precision identification. For a simple sine wave input, the minimum required sample rate that provides an accuracy of 0.01% is 223 times the input frequency. Currently, the fastest single twelve bit ADC chip has a maximum sample rate of approximately 40 million samples per second (MSPS), which would limit the input frequency to 400 kHz if the sample error is to be less than 0.05%, or 4.0 MHZ for an error no larger than 1.0%.

It is possible to increase the effective sampling rate of an ADC by incorporating an interpolation circuit. With an interpolation circuit, additional samples are provided between the measured points. However, the drawback is that the input bandwidth must be limited to avoid inducing errors into the interpolated values.

Faster sampling rates may also be obtained by using ten bit, eight bit, or six bit ADCs. However, the accuracy is then limited by the resolution of the ADC. Generally, the nominal input signal is scaled to approximately two-thirds of full scale. At this input sampling rate, the error due to ADC quantization is 0.073% for a twelve bit ADC, 0.293% for a ten bit ADC, 1. 172% for an eight bit ADC, and 4.688% for a six bit ADC. Therefore, current ADC technology provides peak detection that is limited to low frequencies (less than about 1 MHZ) if good accuracy (better than about 0.5%) is required. Furthermore, at high sample rates, it is difficult to design a digital magnitude comparator which will adequately examine the ADC output for peak identification. In addition, this method provides a peak time which is only known to within one ADC sample interval, which is not accurate enough for some applications.

An additional ADC peak determination methodology consists of utilizing an ADC that is triggered to measure only at the input signal peaks. This method has the problem of generating an appropriate trigger signal. It is not possible to generate a trigger at the time of the peak, but rather a trigger is presented which is delayed by a fixed amount of time after the peak has occurred. This is due to the process selecting a peak based upon a detected decrease in amplitude. Therefore, the analog signal must be delayed without distortion and the delay must exactly equal the delay in the trigger circuit. However, it is very difficult to build a wide band analog delay which does not distort the input signal. In addition, it is also very difficult to match the delays of the trigger circuit and the analog delay.

The trigger circuit must detect the time of the peak with great accuracy. The delay from the input signal peak to the trigger output must also be very stable. Timing variation in the trigger circuit causes significant error in the recorded peak value. If a desired amplitude accuracy of 0.05% is desired, the differences in the time delay of the analog delay element and the trigger channel must be $5.03 \times 10^{-3}$ the input period. For example, with a one MHZ sine wave input, a timing accuracy of ±7.1 nanoseconds is required to maintain an amplitude accuracy of 0.1%. Furthermore, to determine the timing of the peaks requires additional circuitry (i.e., a digital time interval analyzer which measures the timing of a trigger output).

Based upon the foregoing, it is an object of the present invention to provide peak detection which has a high degree of accuracy for a wide bandwidth. Furthermore, it is an object of the present invention to provide the accurate and wide bandwidth peak detection using an apparatus and methodology which is relatively inexpensive to implement.

SUMMARY OF THE INVENTION

In accordance with the teachings of the present invention, a method for detecting a peak in a continuous waveform is provided. The method consists of representing the continuous waveform as discrete data, examining the discrete data to identify at least one discrete data peak. Storing in a discrete domain data structure having at least one record that identifies the discrete data peak and identifies at least two discrete data in a proximally adjacent neighborhood to the discrete data peak. Providing at least one continuous domain transformation process that defines a relationship between discrete data and continuous data, and using the at least one record to access the continuous domain transformation process to identify the peak in the continuous waveform.

BRIEF DESCRIPTION OF THE DRAWINGS

Other objects and advantages of the invention will become apparent upon reading the following detailed description and upon reference to the following drawings, in which.

DESCRIPTION OF THE PREFERRED EMBODIMENTS

The following description of the preferred embodiment is merely exemplary in nature and is in no way intended to limit the invention or its application or uses.

Figure 1:
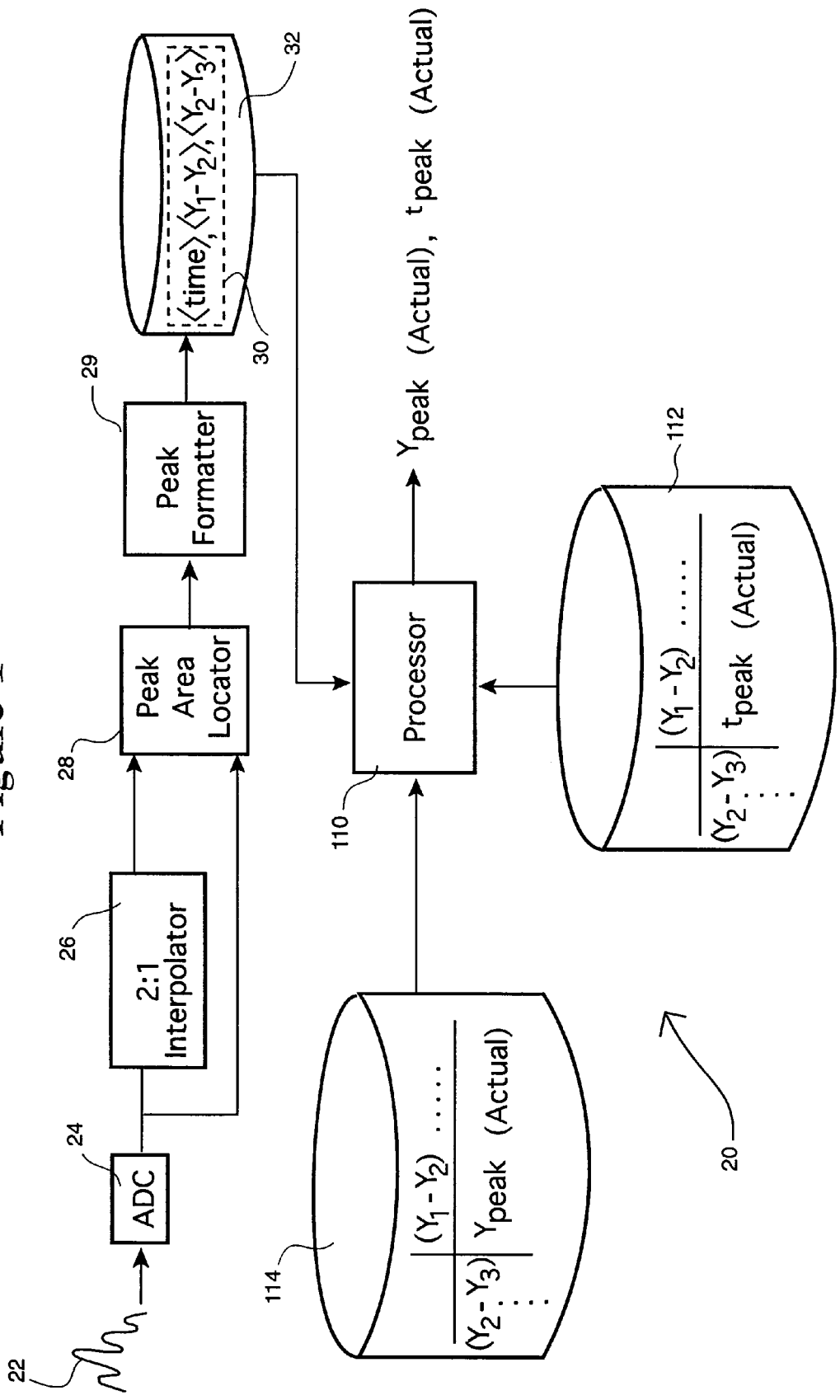
FIG. 1 is a block diagram of the waveform peak detector of the preferred embodiment of the present invention.

FIG. 1 shows the peak detector 20 according to the preferred embodiment of the present invention. An input waveform 22 is presented to an analog-to-digital converter (ADC) 24, which samples at a constant rate. In this particular embodiment, the ADC 24 is followed by a 2:1 interpolator circuit 26 which effectively doubles the effective sampling rate of the ADC 24. However, when the interpolator 26 is utilized, the input of the peak detector 20 must be restricted to frequencies below a threshold value, otherwise errors will be introduced due to the interpolation process. The data from the ADC 24 and interpolator 26 are presented to the peak area locator 28 which identifies three points nearest the peak of the input waveform 22.

After a peak has been located by the locator 28, the three data points and the time stamp corresponding to the second sample are formatted by the peak formatter 29. This digital circuit performs some basic mathematical operations and produces a single data word 30 which is transferred to memory 32. A processor 110 is provided which utilizes the data word 30 in order to perform an indexing operation in two pre-calculated tables. The peak amplitude table 114 contains the resulting values for determining the true amplitude of the peak ($y_{peak}$ (Actual)), and the peak time table 112 has the resulting values for determining the true time of the peak ($t_{peak}$ (Actual)). This configuration produces a very precise identification of the peak amplitude and time, while minimizing processing time.

Figure 2:
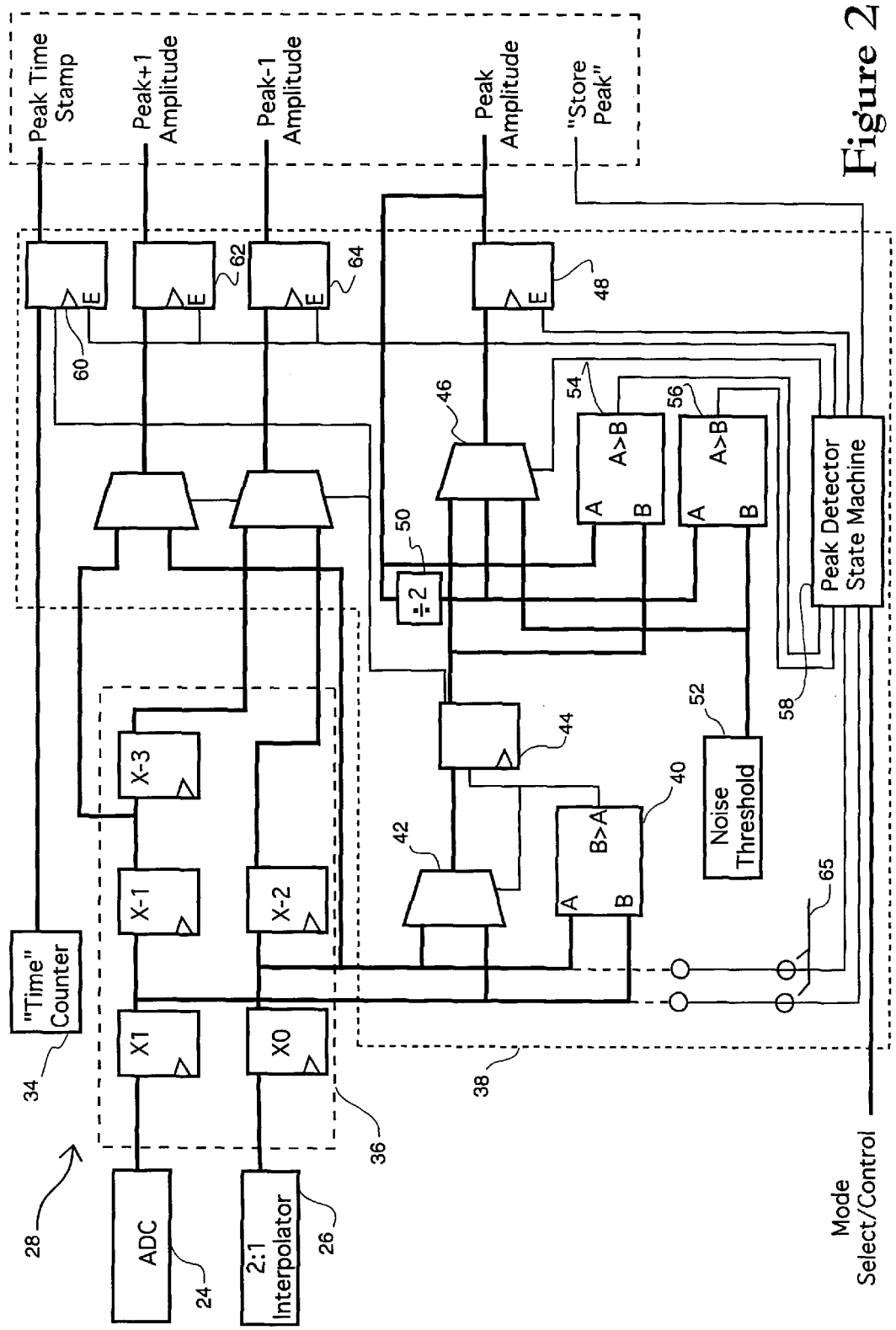
FIG. 2 is a schematic illustrating additional details of the peak area locator in further detail.

FIG. 2 shows the peak area locator 28 in further detail. The three points near the peak are identified by this locator 28 through a sequential evaluation of the measured values provided by the ADC 24 and interpolator 26. In order to locate a series of three samples which are near a peak, the following four characteristics of three consecutive samples are sought: (1) the second value is greater than or equal to the first value; (2) the second value is greater than or equal to the third value; (3) the second value is greater than the currently latched peak value; and (4) all three values are greater than a threshold value. Only when these requirements are met will the three measurements be transferred to the peak formatter and ultimately to memory, for subsequent peak amplitude and time determination.

The peak area locator 28 has a time counter 34, data pipeline 36, and a peak detection block 38. There are actually two peak detection blocks, one for positive peak detection and another for negative peak detection. However, in order to maintain simplicity and clarity in this description, only the positive peak detection block 38 is shown.

The locator 28 receives the output from the 2:1 interpolator 26 and the ADC 24, with the output of the interpolator 26 representing the earlier of the two samples. The two samples are compared by comparator 40 and the larger of the two is selected by multiplexor 42 and passed to an intermediate data latch 44. The output of the intermediate data latch 44 is provided as one of the inputs to a three input multiplexor 46. The three input multiplexor 46 selects the value which is to be provided to the current peak latch 48. The other two inputs to this three input multiplexor 46 are one-half the value of the current peak amplitude, as provided by the divider 50, and the noise threshold input 52, which is a user selected value.

The divider 50 and noise threshold 52 inputs are used to prevent false triggering on noise. These two inputs provide both a fixed and variable threshold level, with the larger of the two values used as the limiting factor.

The comparison between the current peak value and the newly acquired value, as held by the intermediate data latch 44, and the comparison between one half the current peak value and the noise threshold 52, are conducted by comparators (54, 56), with the comparison results provided as input to the peak detector state machine 58. Based upon the comparison results, the peak detector state machine 58 provides the corresponding commands to the three input multiplexor 46, current peak latch 48, peak time stamp latch 60, peak +1 amplitude latch 62, and peak −1 amplitude latch 64, allowing the current peak data points and the associated peak time stamp to be updated when a larger peak is found.

The peak detector state machine 58 also analyzes the sign bits 65 of the two data points provided by the ADC 24 and interpolator 26 in order to determine if the input signal has crossed zero. When the signs differ between the two input values, the peak detector state machine 58 provides a strobe which indicates that the peak has been identified for the current interval, and that the peak amplitude and time are to be calculated with the three currently held data points.

Figure 3:
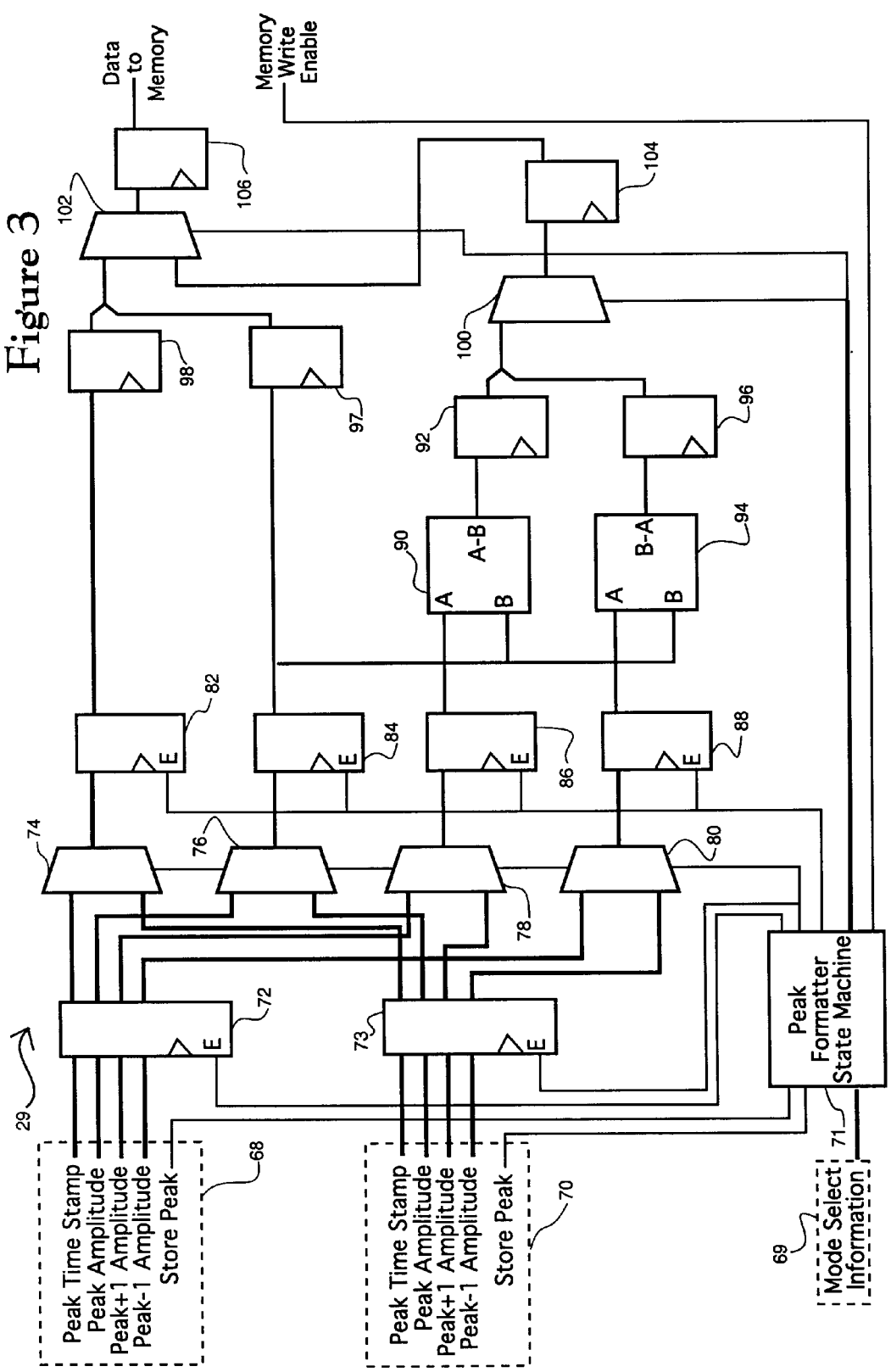
FIG. 3 is a schematic illustrating additional details of the peak formatter in further detail.

FIG. 3 shows the digital circuit of the peak formatter 29 in further detail. The formatter 29 receives the three data samples from the peak area locator and calculates arguments of $(y_2-y_1)$ and $(y_3-y_2)$ which are subsequently used by the processor in a table look-up operation for the true peak time and amplitude. As can be seen, the formatter 29 receives both positive peak information 68 and the negative peak information 70. The peak formatter state machine 71 controls the processing of either the positive peak information 68 or negative peak information 70 based upon the mode select information 69 as received from the peak area locator.

The positive and negative peak information (68, 70) is initially stored in receipt latches (72, 73) that pass the data to four multiplexors (74, 76, 78, 80) which receive the peak time stamp, peak amplitude, peak$_{+1}$ amplitude, and peak$_{-1}$ amplitude. The state machine 71 provides the necessary commands to allow proper processing of either negative or positive peak information, which is then stored in four intermediate data latches (82, 84, 86, 88).

Three of the intermediate data latches (82, 84, 86, 88), holding the values for the peak$_{-1}$, peak$_{+1}$, and peak amplitude (i.e., $y_1$, $y_3$ and $y_2$), are provided to two comparators (90, 94) in order to calculate the amplitude difference between the point nearest the peak ($y_2$) and the adjacent samples ($y_1$ and $y_3$). The results from the comparators (90, 94) are provided two difference latches (92, 96), which will hold the resulting values of $(y_2-y_1)$ and $(y_3-y_2)$.

Under the control of the state machine 71, the arguments contained in the difference latches (92, 96) and the single value of $y_2$ and peak time stamp held in final position data latches (97, 98), are subsequently formatted into a single data word by the two final stage multiplexors (100, 102), resulting differences data latch 104, and complete word data latch 106. The resulting word held by the complete word data latch 106 thereby has the second data sample time stamp, and values for $(y_2-y_1)$ and $(y_3-y_2)$, which is used for the subsequent table look-up operation.

Figure 4:
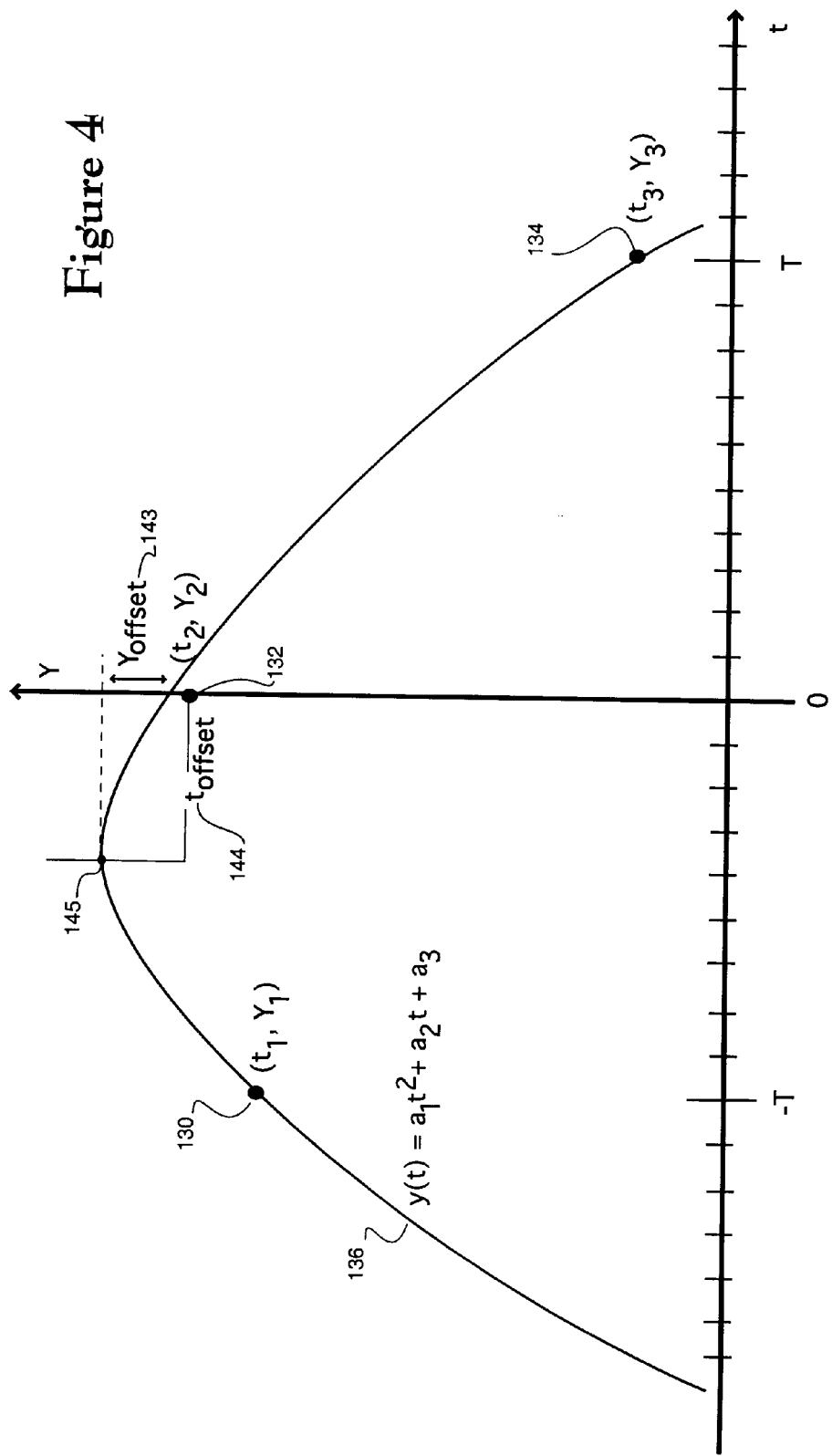
FIG. 4 is an illustration of three sampled points utilized to calculate the true peak with a least squares curve fit second order polynomial.

The foregoing identification of the peak amplitude and time with the three selected points is based upon a least squares curve fit to a second order polynomial. Examination of the least squares fitted polynomial may then be used to find the time of the true peak. Specifically, this is done by identifying where the rate of change (i.e. differential of the corresponding second order polynomial) is zero. Once the time of the true peak is identified, the original second order polynomial may be used in order to determine the exact amplitude of the peak. Referring to FIG. 4, the peak calculations are based upon the fact that the three measured points (130, 132, 134) are fitted to a polynomial which describes the curve 136.

The polynomial which describes curve 136 is of the form:

$$y(t)=a_1 t^2 + a_2 t + a_3 \qquad (1)$$

where:

y=signal amplitude t=time, and $a_1, a_2, a_3$=constants.

The derivative of this polynomial has the form:

$$y'(t)=2a_1 t + a_2 \qquad (2)$$

with the peak occurring when equation (2) is equal to zero or when:

$$t=-a_2/2a_1 \qquad (3)$$

with the peak amplitude expressed as:

$$y_{peak}=a_3 - (a_2^2/(4a_1)) \qquad (4)$$

Therefore, in order to determine the peak amplitude and time, constants $a_1$, $a_2$, and $a_3$ must be determined.

The three constants may be determined by realizing that all three measured points must fit the polynomial equation of equation (1), or alternatively, that the following three equations must be satisfied:

$$y_1(t_1)=a_1 t_1^2 + a_2 t_1 + a_3 \qquad (5)$$

$$y_2(t_2)=a_1 t_2^2 + a_2 t_2 + a_3 \qquad (6)$$

$$y_3(t_3)=a_1 t_3^2 + a_2 t_3 + a_3 \qquad (7)$$

Equations (5) through (7) can be expressed in matrix form as:

$$Y=Ta \qquad (8)$$

where:

$$Y = \begin{bmatrix} y_1 \\ y_2 \\ y_3 \end{bmatrix}, T = \begin{bmatrix} 1 & t_1 & t_1^2 \\ 1 & t_2 & t_2^2 \\ 1 & t_3 & t_3^2 \end{bmatrix}, a = \begin{bmatrix} a_3 \\ a_2 \\ a_1 \end{bmatrix}$$

As previously indicated, the waveform samples are taken by the ADC at a constant rate, therefore the measurements for the three points are equally spaced. This allows equation (8) to be greatly simplified by defining the time of the second sample $t_2$ to be 0, the time of the first sample $t_1$ to be $-T$, and the time of the third sample $t_3$ to be $+T$, where T is the ADC sample period.

Based upon these interval definitions, equation (8), in matrix form, becomes:

$$\begin{bmatrix} y_1 \\ y_2 \\ y_3 \end{bmatrix} = \begin{bmatrix} 1 & -T & T^2 \\ 1 & 0 & 0 \\ 1 & T & T^2 \end{bmatrix} \begin{bmatrix} a_3 \\ a_2 \\ a_1 \end{bmatrix} \qquad (9)$$

Equation (9) can be further simplified if the time interval is scaled such that T=1. With this, equation (9) simplifies to:

$$\begin{bmatrix} y_1 \\ y_2 \\ y_3 \end{bmatrix} = \begin{bmatrix} 1 & -1 & 1 \\ 1 & 0 & 0 \\ 1 & 1 & 1 \end{bmatrix} \begin{bmatrix} a_3 \\ a_2 \\ a_1 \end{bmatrix} \qquad (10)$$

From equation (10), $a_1$, $a_2$, and $a_3$ may be calculated using numerical computation techniques.

Calculation of the peak amplitude and time directly from the foregoing equations is processor intensive when a large number of data points are involved. This is due to the evaluation of each equation requiring multiple additions, multiplications, and divisions. Therefore, in order to process a large quantity of data in an expedient and efficient manner, the preferred embodiment uses the previously described digital circuitry to perform a portion of the calculations, yielding index values which are then used to retrieve the resulting values from precalculated lookup tables. These lookup tables contain precalculated values which need only be calculated once (in this illustration, at the time of initialization).

Referring to FIG. 1, the peak formatter 29 generated values of $(y_2-y_1)$ and $(y_3-y_2)$ are used by the processor 110 as an index into the peak time table 112 and peak amplitude table 114, which were initialized with precalculated values. In the preferred embodiment, each table contains 220 entries with each entry being a two byte integer. This means that the two tables require a total of four megabytes of memory, and allows the processor 110 to perform time consuming calculations only once, thereby reducing the run time calculation time.

The use of $(y_2-y_1)$ and $(y_3-y_2)$ in order to determine the peak time and amplitude is based upon the fact that $a_1$, $a_2$, and $a_3$ can be expressed in terms of $y_1$, $y_2$, and $y_3$. Specifically, equation (10) may be solved for $a_1$, $a_2$, and $a_3$ in terms of $y_1$, $y_2$, and $y_3$ using an augmented matrix or other computational technique. This results in:

$$a_3 = y_2 \qquad (11)$$

$$a_2 = (y_3 - y_1)/2 \qquad (12)$$

$$a_1 = (y_3 - 2y_2 + y_1)/2 \qquad (13)$$

If equations (11)–(13) are inserted into equations (2) and (3), the following results:

$$y_{peak} = y_2 + (y_3 - y_1)^2 / (8(2y^2 - y_3 - y_1)) \qquad (14)$$

and $$t_{peak} = (y_3 - y_1)/((2(2y_2 - y_3 - y_1)) \qquad (15)$$

where $t_{peak}$ is the time offset ($\Delta t$) 144 from the second measured point 132 ($t_2$), which is in multiples of the constant sample period that is used to simplify equation 9 (as shown in FIG. 3).

In order to calculate the look-up tables, equations (14) and (15) are modified to use the arguments $(y_2-y_1)$ and $(y_3-y_2)$. Specifically, the following definitions are made:

$$A = (y_2 - y_1) \qquad (16)$$

$$B = (y_3 - y_2) \qquad (17)$$

which are inserted into equations (14) and (15) so that:

$$y_{peak} = y_2 + ((A+B)^2 / 8(A-B)) \qquad (18)$$

and $$t_{peak}=(A+B)/((2(A-B)) \quad (19)$$

Therefore, at initialization, a $Y_{offset}$ look-up table is generated with a value corresponding to the arguments of $(y_2-y_1)$ and $(y_3-y_2)$ based upon:

$$Y_{offset}=(A+B)^2/8(A-B) \quad (20)$$

In addition, a $t_{offset}$ look-up table is generated at initialization with the $(y_2-y_1)$ and $(y_3-y_2)$ arguments from:

$$t_{offset}=(A+B)/((2(A-B)) \quad (21)$$

Referring to FIG. 3, it can be seen that with a value for $y_{offset}$ 143 and a value for $t_{offset}$ 144, in conjunction with the time stamp and amplitude of the second sample point 132, a highly accurate determination of the amplitude and time of the true peak 145 may be made. It should be understood that as a result of scaling equation (10) by the ADC sample period, the values produced by equations (15), (19), and (21) are multiples of the this sample period.

Those skilled in the art can now appreciate from the foregoing description that the broad teachings of the present invention can be implemented in a variety of forms. The principles provided here are readily adaptable for many applications, as peak detection is an important and prevalent component in many applications and analysis tools. Therefore, the true scope of the invention is vast, and other modifications will become apparent to the skilled practitioner upon a study of the drawings, specifications and following claims.

What is claimed is:

1. A method for detecting a waveform peak in a continuous waveform, comprising the steps of:
   representing the continuous waveform as discrete data;
   examining said discrete data to identify at least one discrete data peak having an amplitude value;
   storing at least one record in a discrete domain data structure, wherein said at least one record:
      (a) identifies said discrete data peak; and
      (b) identifies at least three discrete data in a proximally adjacent neighborhood to said discrete data peak, each of said at least three discrete data having an amplitude value;
   providing at least one continuous domain transformation process that defines a curve-fitting relationship between discrete data and continuous data; and
   applying said continuous domain transformation process to said stored at least one record such that the discrete data peak that is representative of the waveform peak in said continuous waveform is identified.

2. The method of claim 1 wherein said continuous domain transformation process includes the step of retrieving values for the discrete data peak from a look-up table.

3. The method of claim 1 wherein said continuous domain transformation process includes the step of calculating a plurality of discrete data peak results for a corresponding plurality of peak occurrences in said continuous waveform.

4. The method of claim 1 wherein said step of representing the continuous waveform as discrete data is performed by representing the continuous waveform as discrete data evenly spaced in time.

5. The method of claim 1 wherein the step of storing in said discrete domain data structure includes storing a time value associated with said discrete data peak.

6. The method of claim 1 wherein the step of storing in said discrete domain data structure includes storing an amplitude value associated with said discrete data peak.

7. The method of claim 1 wherein the step of storing at least one record further includes storing n adjacent neighborhood data members that are associated with said discrete data peak, where n is a predetermined integer greater than two.

8. The method of claim 1 wherein said at least one continuous domain transformation process further includes the step of accessing said continuous domain transformation process to identify a continuous domain time value corresponding to said waveform peak in said continuous waveform.

9. The method of claim 1 wherein said at least one continuous domain transformation process further includes the step of accessing said continuous domain transformation process to identify a continuous domain amplitude value corresponding to said waveform peak in said continuous waveform.

10. The method of claim 1 wherein said continuous domain transformation process is based on a least squares curve fit of a second order polynomial.

11. An apparatus for detecting a waveform peak in a continuous waveform, comprising:
   a converter for representing the continuous waveform as discrete data;
   a peak area locator for examining said discrete data to identify at least one discrete data peak area including a discrete data peak;
   a discrete domain data structure having at least one record that:
      (a) identifies said discrete data peak; and
      (b) identifies at least three discrete data in a proximally adjacent neighborhood to said discrete data peak; and
   a processor operable to employ at least one continuous domain transformation process that defines a curve-fitting relationship between discrete data and continuous data such that said stored at least one record is transformed in order to identify the discrete data peak representative of the waveform peak in said continuous waveform.

12. The apparatus of claim 11 further comprising a look-up table of predetermined continuous data peaks related to predetermined discrete data peaks, wherein the look-up table is accessed by said processor during the transformation process.

13. The apparatus of claim 11 wherein said processor further includes a calculation process that supplies a continuous data peak output in response to a discrete data peak input.

14. The apparatus of claim 11 wherein said converter represents the continuous waveform as discrete data evenly spaced in time.

15. The apparatus of claim 11 wherein said discrete domain data structure includes a data member for storing a time value associated with said discrete data peak.

16. The apparatus of claim 11 wherein said discrete domain data structure includes a data member for storing an amplitude value associated with said discrete data peak.

17. The apparatus of claim 11 wherein said record includes a representation of n adjacent neighborhood data members in association with said discrete data peak, where n is a predetermined integer greater than or equal to two.

18. The apparatus of claim 11 wherein said discrete data peak further comprises a time value corresponding to said waveform peak in said continuous waveform.

19. The apparatus of claim 11 wherein said discrete data peak further comprises an amplitude value corresponding to said waveform peak in said continuous waveform.

20. A method for detecting a waveform peak in a continuous waveform, comprising:

representing said continuous waveform as discrete data;

examining said discrete data to identify first, second, and third data points near a data peak, said first, second, and third data points identified based upon the characteristics that:
  (a) the second data point has an amplitude greater than or equal to the first data point; and
  (b) the second data point has an amplitude greater than or equal to the third data point;

storing said first, second, and third data points in a discrete domain data structure;

generating a table from at least one curve-fit transformation process, wherein said table relates discrete data points to at least one characteristic of said data peak;

retrieving said first, second, and third data points from the discrete domain data structure: and querying the table based upon said first, second and third data points in order to identify at least one characteristic of said data peak;

wherein, the data peak represents an estimate for the waveform peak in the continuous waveform.

* * * * *